United States Patent
Bailey et al.

(10) Patent No.: US 6,233,149 B1
(45) Date of Patent: May 15, 2001

(54) HIGH POWER INVERTER AIR COOLING

(75) Inventors: Ronald Barry Bailey; Vinod Kumar Singh; Wayne Alexander Kennedy, all of Erie, PA (US); Eric Joseph Wildi, Ladue, MO (US)

(73) Assignee: General Electric Company, Schnectady, NY (US)

( * ) Notice: Subject to any disclaimer, the term of this patent is extended or adjusted under 35 U.S.C. 154(b) by 0 days.

(21) Appl. No.: 08/839,113

(22) Filed: Apr. 23, 1997

(51) Int. Cl.$^7$ ........................................ H05K 7/20
(52) U.S. Cl. .................. 361/704; 361/683; 361/707; 361/709; 174/16.3; 165/104.33
(58) Field of Search ..................... 361/683, 685, 361/689, 690, 697, 700, 712, 721, 723, 692, 694; 257/706–727, 696, 752; 165/80, 80.2, 80.3, 80.4, 76, 185, 104.33, 104.34, 122; 29/890.03, 509; 174/16.3, 16.1; 62/3.6, 3.2, 259.2, 208, 209

(56) References Cited

U.S. PATENT DOCUMENTS

| | | | |
|---|---|---|---|
| 2,932,953 | * 4/1960 | Becket et al. ............................... 62/3 |
| 4,459,638 | * 7/1984 | Brehm et al. ......................... 361/384 |
| 4,520,425 | * 5/1985 | Ito ........................................ 361/384 |
| 4,691,274 | 9/1987 | Matouk et al. . |
| 4,772,999 | 9/1988 | Fiorina et al. . |
| 4,790,373 | * 12/1988 | Raynor et al. ........................ 165/185 |
| 4,864,468 | * 9/1989 | Weiss ................................... 361/384 |
| 4,872,102 | 10/1989 | Getter . |
| 4,884,631 | 12/1989 | Rippel . |
| 5,038,858 | * 8/1991 | Jordan et al. ......................... 165/185 |
| 5,132,896 | 7/1992 | Nishizawa et al. . |
| 5,170,336 | 12/1992 | Getter et al. . |
| 5,172,310 | 12/1992 | Deam et al. . |
| 5,202,578 | 4/1993 | Hideshima . |
| 5,204,804 | * 4/1993 | Bailey et al. ......................... 361/386 |
| 5,235,491 | * 8/1993 | Weiss ................................... 361/694 |
| 5,245,527 | 9/1993 | Duff et al. . |
| 5,253,613 | 10/1993 | Bailey et al. . |
| 5,434,770 | 7/1995 | Dreifuerst et al. . |
| 5,444,295 | 8/1995 | Lake et al. . |
| 5,491,370 | 2/1996 | Schneider et al. . |
| 5,492,842 | 2/1996 | Eytcheson et al. . |
| 5,493,472 | 2/1996 | Lavene . |
| 5,504,378 | 4/1996 | Lindberg et al. . |
| 5,517,063 | 5/1996 | Schantz et al. . |
| 5,533,257 | * 7/1996 | Romero et al. .................... 29/890.03 |
| 5,539,254 | 7/1996 | Eytcheson et al. . |
| 5,542,176 | * 8/1996 | Serizawa et al. ................. 29/890.03 |
| 5,563,447 | 10/1996 | Lake et al. . |
| 5,565,705 | 10/1996 | Romero et al. . |
| 5,631,821 | 5/1997 | Muso . |
| 5,655,375 | * 8/1997 | Ju ............................................ 62/3.6 |
| 5,694,312 | 12/1997 | Brand et al. . |
| 5,712,802 | 1/1998 | Kumar et al. . |
| 5,894,407 | * 4/1999 | Aakalu et al. ......................... 361/695 |
| 6,088,225 | * 7/2000 | Parry et al. ........................... 361/704 |

* cited by examiner

Primary Examiner—Leo P. Picard
Assistant Examiner—Michael Datskovsky
(74) Attorney, Agent, or Firm—Ann Agosti; Carl Rowold

(57) ABSTRACT

An electrically powered vehicle includes an inverter mounted in the vehicle, the inverter having a plurality of high power IGBT modules for converting DC power to AC power for application to a plurality of AC electric motors connected in driving relationship to wheels on the vehicle. Each of the IGBT modules is mounted in thermal transfer relationship to an electrically isolated base plate and each base plate has a plurality of closely spaced, parallel slots formed across one surface with a plurality of fins fitted into the slots and extending from the base plate. The system includes apparatus for mounting the IGBT modules to a wall separating an electronics compartment from an air supply and air exhaust compartment. Air from an air supply plenum in the air supply compartment is directed into the fins extending from the IGBT base plate and exhaust through an exhaust conduit. The vehicle includes a blower to force air to flow through the fins extending from the base plate.

6 Claims, 4 Drawing Sheets

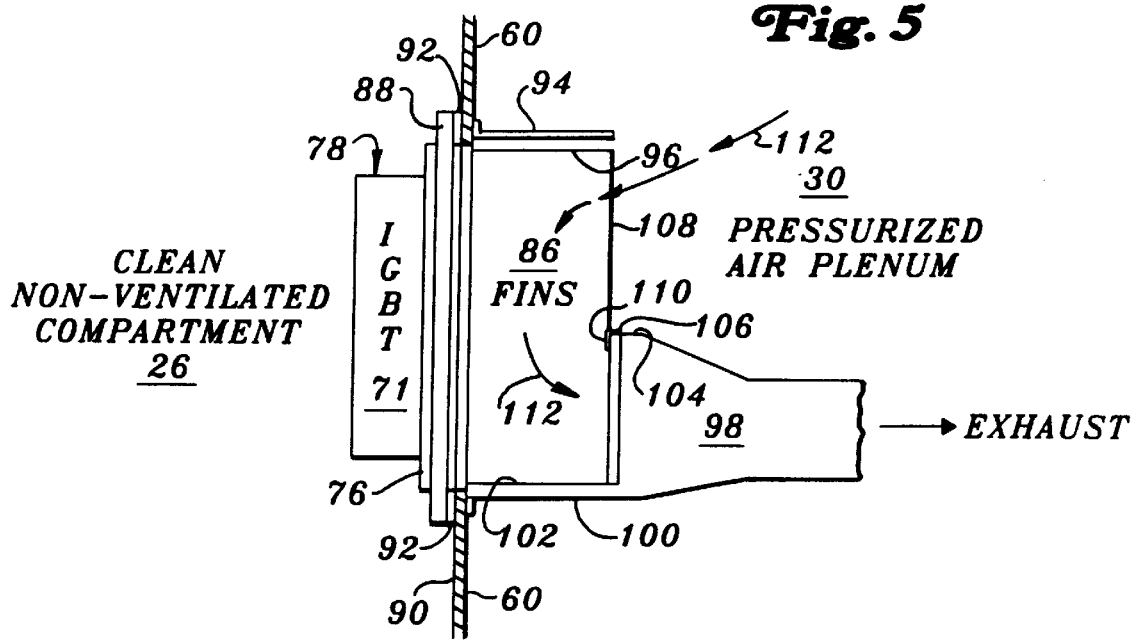
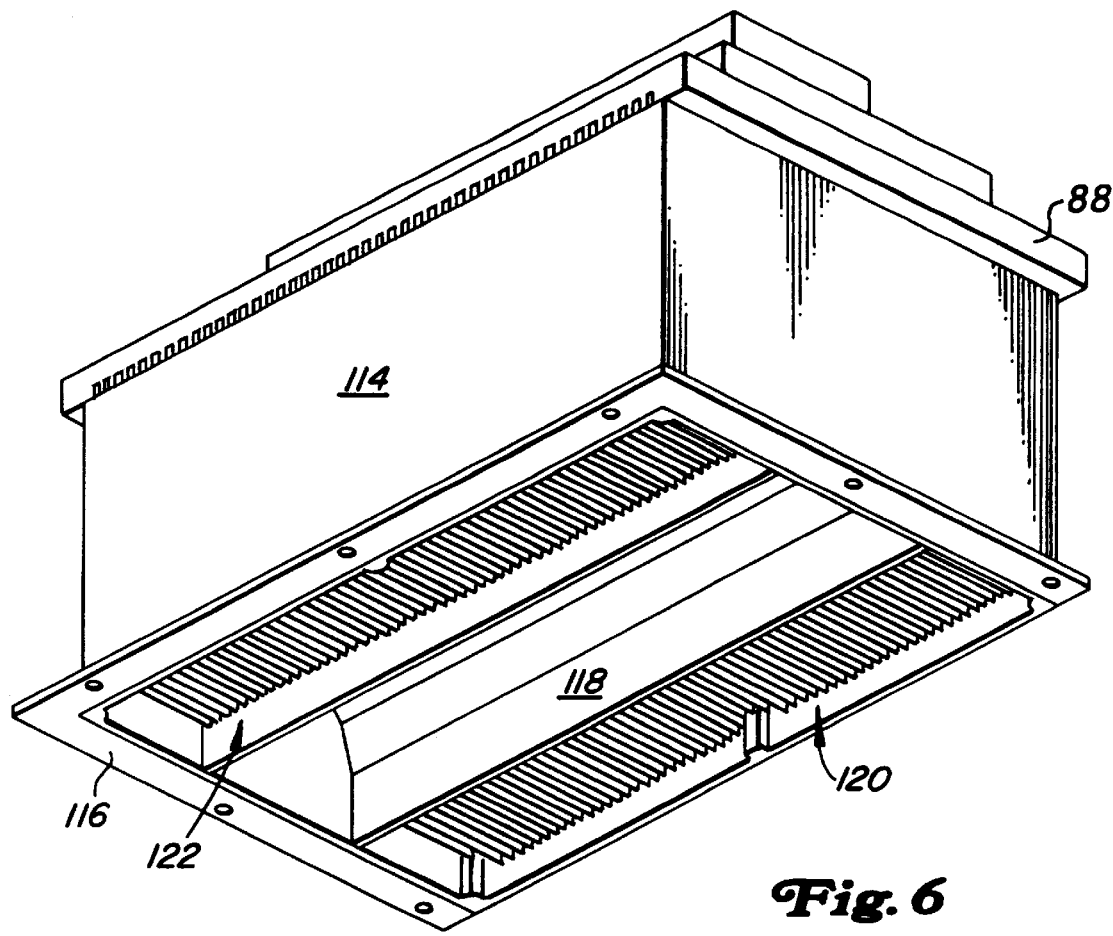

HIGH POWER INVERTER AIR COOLING

BACKGROUND OF THE INVENTION

This invention relates to high-power semiconductor switching power regulators such as are used in propulsion systems of diesel-electric locomotives and the like and, more particularly, to a method and apparatus which provide sufficient cooling capacity and easy installation and maintenance of insulated gate bipolar transistors (IGBT) in such power regulators.

Traction vehicles such as, for example, locomotives, employ electric traction motors for driving wheels of the vehicles. In some of these vehicles, the motors are alternating current (AC) motors whose speed and power are controlled by varying the frequency and current of AC electric power supplied to the motors. Commonly, the electric power is supplied at some point in the vehicle system as direct current power and is thereafter inverted to AC power of controlled frequency and amplitude. The electric power may be derived from an on-board alternator driven by an internal combustion engine or may be obtained from a wayside power source such as a third rail or overhead catenary.

In prior art systems the power is inverted in a solid-state inverter incorporating a plurality of diodes and gate turn-off thyristors (GTO). in a locomotive, large off-highway vehicle, or transit application, the traction motors may develop up to 1000 horsepower per motor thus requiring very high power handling capability by the associated inverter. This, in turn, requires semiconductor switching devices such as GTOs which are capable of controlling such high power and of dissipating significant heat developed in the semiconductor devices due to internal loss generating characteristics.

The semiconductor devices are mounted on heat transfer devices such as heat sinks which aid in transferring heat away from the semiconductor devices and thus preventing thermal failure of the devices. For these very high power semiconductors it is desirable to use heat sinks having generally hollow interiors through which cooling air can be forced to remove accumulated heat. Each heat sink is mounted to an air plenum and cooling air is blown through the heat sinks and in close proximity to the electrical circuit area in which the semiconductors are located. The electrical circuit area may include the various control and timing circuits, including voluminous low power semiconductors, used in controlling switching of the power semiconductors.

In locomotive applications the cooling air is typically derived from blowers drawing air from overhead of the locomotive. The incoming air usually contains contaminants including diesel fumes and dust. A spin filter or inertial filter is used to at least partially clean this cooling air. An inverter for large AC motor applications typically includes six high power GTO devices requiring heat sinks and forced air cooling. Each of these devices are generally press packs which require double side cooling for these high power applications. A common arrangement thus requires twelve heat sinks per inverter. On a six axle locomotive, the inverters alone will include 72 heat sinks requiring cooling air. This number of heat sinks requires a high volume flow of cooling air and concomitant increase in inertial filter capacity. Further, the GTO devices require complex gating circuits and snubber circuits with as many as 250 components to control operation of the devices in a switching mode. Still further, the gating circuits must be of relatively high power since the GTO may require as much as 100 watts for gate control.

SUMMARY OF THE INVENTION

Accordingly, it is desirable to provide a semiconductor switching system which uses fewer components, has lower power requirements for control and has a corresponding reliability improvement and lower cost. The above and other desirable features are attained in one form in a power converter system for an electric traction motor vehicle in which a plurality of high power IGBT devices are connected in circuit with at least one electric traction motor for controlling electric power to the motor. The IGBT devices are each thermally mounted on generally flat plate heat sinks having a plurality of fins extending therefrom and adapted for passing cooling air therethrough for extracting heat from the devices. The fins may be attached directly to the module heat sink or attached to a separate thermally conductive plate which is thermally bonded to the heat sink. Each of the heat sinks are mounted to a common air plenum forming one wall of an electrical circuit area of the vehicle with the fins extending through the wall and into the plenum. Cooling air is directed through the fins flowing towards the heat sink base plate and out through an exhaust conduit. A barrier is used at each end of the fins, and the exhaust conduit overlays a portion of the fins so as to form a pathway forcing the cooling air close to the heat sink base plate. Alternately, the fins may be enclosed in a containment structure attached at one face to the module base plate and open on an opposite face to admit air into the fins. A central partition is used to define an air inlet and an air outlet through the fins. The mounting uses a single wall surface for both mechanical and air flow connection, minimizes criticality of alignment, and permits easy compression of sealing gaskets.

BRIEF DESCRIPTION OF THE DRAWINGS

For a better understanding of the present invention, reference may be had to the following detailed description taken in conjunction with the accompanying drawings in which:

FIG. 5 illustrates one form of IGBT mounting arrangement in accordance with the present invention.

FIG. 6 illustrates another embodiment of IGBT mounting structure in accordance with the present invention.

DETAILED DESCRIPTION OF THE DRAWINGS

Figure 1:
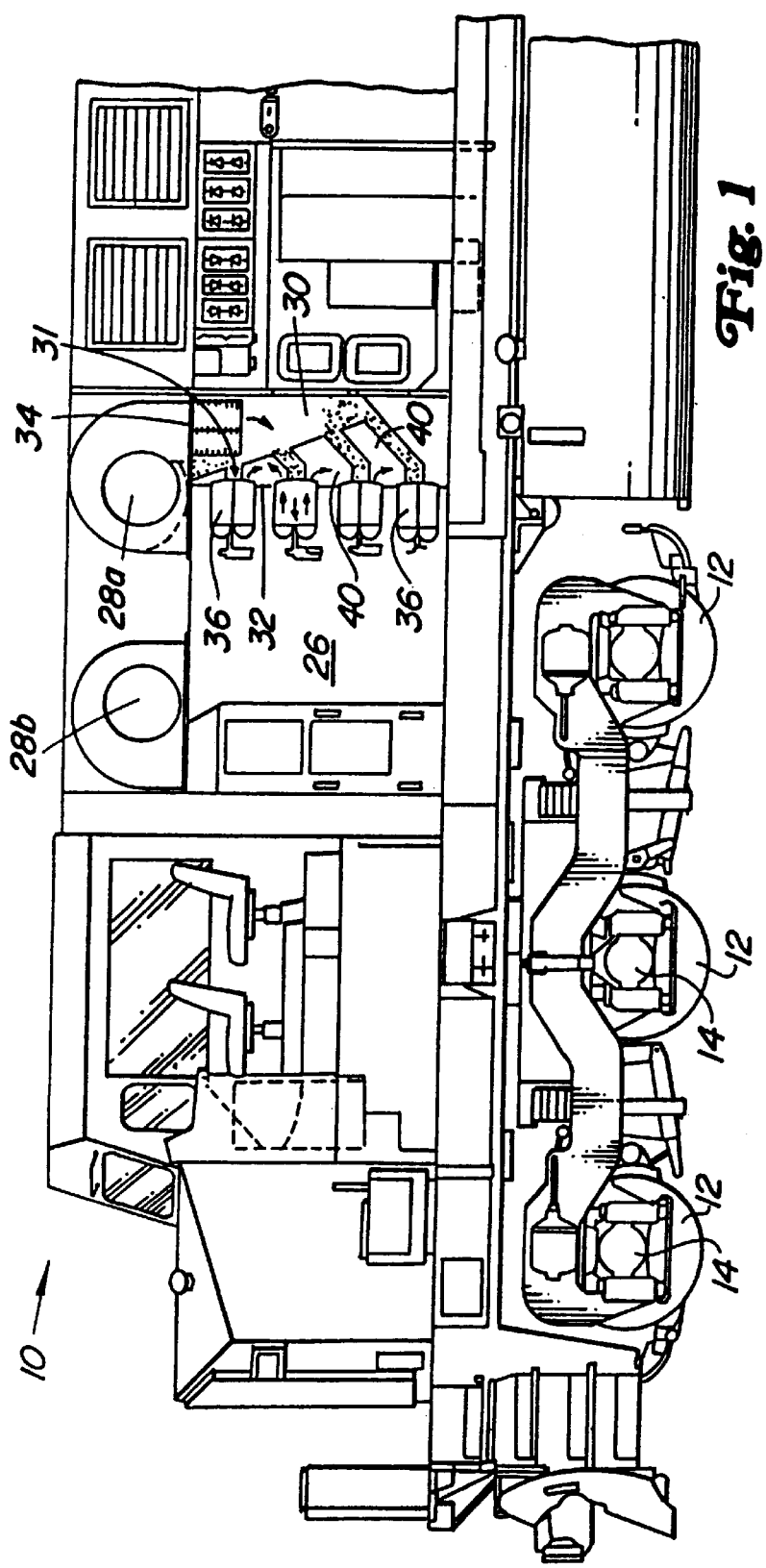
FIG. 1 is a simplified, partial schematic representation of a locomotive employing the teaching of the present invention.

Before turning to the present invention, reference is first made to FIG. 1 which illustrates a simplified, partial cross sectional view of an electric traction vehicle 10 illustrated as a locomotive, incorporating one embodiment of a cooling system for the prior art GTO switching devices. The locomotive 10 includes a plurality of traction motors, not visible in the figure but located behind the drive wheels 12 and coupled in driving relationship to axles 14. The motors are preferably alternating current (AC) electric motors and the locomotive includes a plurality of electrical inverter circuits for controlling electrical power to the motors.

Figure 2:
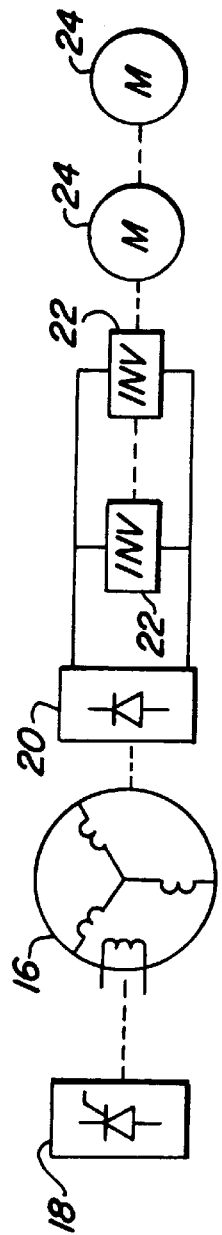
FIG. 2 is a simplified schematic representation of a power circuit for a traction vehicle.

FIG. 2 illustrates a simplified schematic representation of the electrical power system for locomotive 10 including an alternator 16 driven by an on-board internal combustion engine such as a diesel engine (not shown). Power output of the alternator 16 is regulated in a well known manner by field excitation control indicated by block 18. Electrical power from alternator 16 is rectified, block 20, and coupled to inverters 22. Inverters 22 use high power GTO's to convert the rectified power to variable frequency, variable amplitude power for application to AC motors 24.

Referring again to FIG. 1, electrical power circuits are at least partially located in equipment compartment 26. The control electronics for the inverters 22 and field control 18 as well as other electronic components are packaged in a conventional manner on circuit boards held in racks in compartment 26. Mounted above compartment 26 are a pair of blowers 28A, 28B which draw air from above the locomotive and blow it onto selected equipment requiring forced air cooling. Blower 28A blows air downward into distribution zone or plenum 30. One side of plenum 30 is defined by electrical equipment wall 32, generally vertically oriented, which separates compartment 26 from plenum 30. The wall 32 is provided with a plurality of predeterminately arranged apertures 31 for passing cooling air between the plenum 30 and compartment 26. The air from blower 28A is passed through a spin or inertial filter 34 as it enters plenum 30.

Within compartment 26, the high power GTO semiconductor devices are mounted to air cooled heat sinks 36. The heat sinks 36 are attached in cantilever fashion to equipment wall 32. The heat sink 36 is generally hollow, and arranged in pairs with distal ends of each pair being coupled together by an air conduit 38 (shown in FIG. 3). At wall 32, the heat sink ends are sealingly mounted to apertures 31 extending through wall 32. On the plenum side of wall 32, selected ones of the apertures are connected to exhaust conduits 40 which extend outside the plenum 30. The arrangement is such that cooling air from plenum 30 flows into one end of one of a pair of heat sinks and exhausts through another end of the pair of heat sinks.

Figure 3:
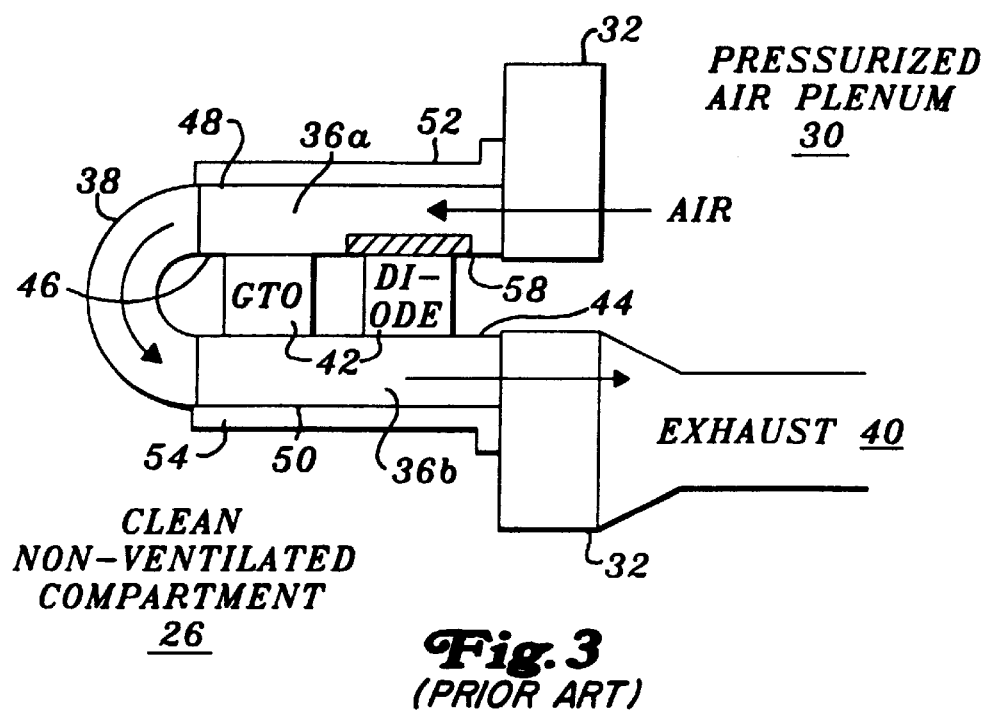
FIG. 3 is an enlarged, simplified representation of a prior art GTO mounting system.

FIG. 3 is an enlarged schematic representation of one of the pairs of heat sinks 36 in which a diode and a GTO are compressively mounted between opposing faces 44, 46 of the heat sinks. The devices 42 are typically press-pack packaged and clamping apparatus (not shown) is provided to compress the heat sinks 36 toward each other with a predetermined compressive force. The outer surfaces 48, 50 of the pair of heat sinks are attached to structural supports 52, 54 which may be bolted to wall 32 for sealingly compressing the ends of the heat sinks 36 over apertures in wall 32. The conduit 38 is bolted to the ends of the heat sinks 36 within compartment 26. The area indicated at 58 represents a cutaway or machined area of heat sink 36A for accommodating variation in the height of a press pack for different semiconductor devices. The diode press pack is generally shorter than that of the GTO and may only require cooling on one terminal surface.

Air from plenum 30 is forced through a first heat sink 36A, passes through conduit 38 and then through heat sink 36B, exiting through exhaust conduit 40. All of the electrical connections for the power system, including the power semiconductors devices 42, may be made within the compartment 26 and attached to the wall 32. However, the contaminated cooling air is contained within the heat sinks 36. By using the serially connected heat sinks 36, the air can be applied first to the anode terminal of the GTO devices, which terminal transfers more heat and requires more cooling, and thereafter applied to the GTO cathode terminal and one terminal of the diode. The single-ended air entry eases assembly and maintainability of a clean air compartment 26. The heat sinks 36 may be electrically isolated by various known means. Typically, the conduit 38 would be formed of a non-conductive material for electrical isolation.

As discussed above, GTO devices, while having advantages over other types of four-layer semiconductor devices such as SCR's (silicon control rectifiers), still have many of the detriments of four-layer devices. For example, GTO's require complex gating circuits and snubber circuits and the gating circuits must supply as much as 100 watts of power to effect conduction of the GTO. It has been known that IGBT devices, which are three-,layer semiconductors, have advantages over GTO devices in requiring less power for control and in not requiring snubber circuits. However, IGBT devices have historically been available only in low power ratings so that use in high power applications required multiple devices in parallel. Parallel arrangements are undesirable, both because of the multiple circuits and because simultaneous turn-on or turn-off is difficult. Without simultaneous on and off switching, one device can be subjected to full load current beyond its capability resulting in device failure. When one device fails, the parallel combination may be unable to carry load current and a cascade failure occurs.

More recently, IGBT devices have been developed which are now capable of carrying current and withstanding voltage comparable to high power GTO devices. Moreover, the IGBT devices are available in modules having a flat plate to remove heat from only one surface which makes the IGBT module easier to mount. One penalty of using IGBT modules is that their losses are higher than those of GTO's making the cooling system very critical.

Figure 4:
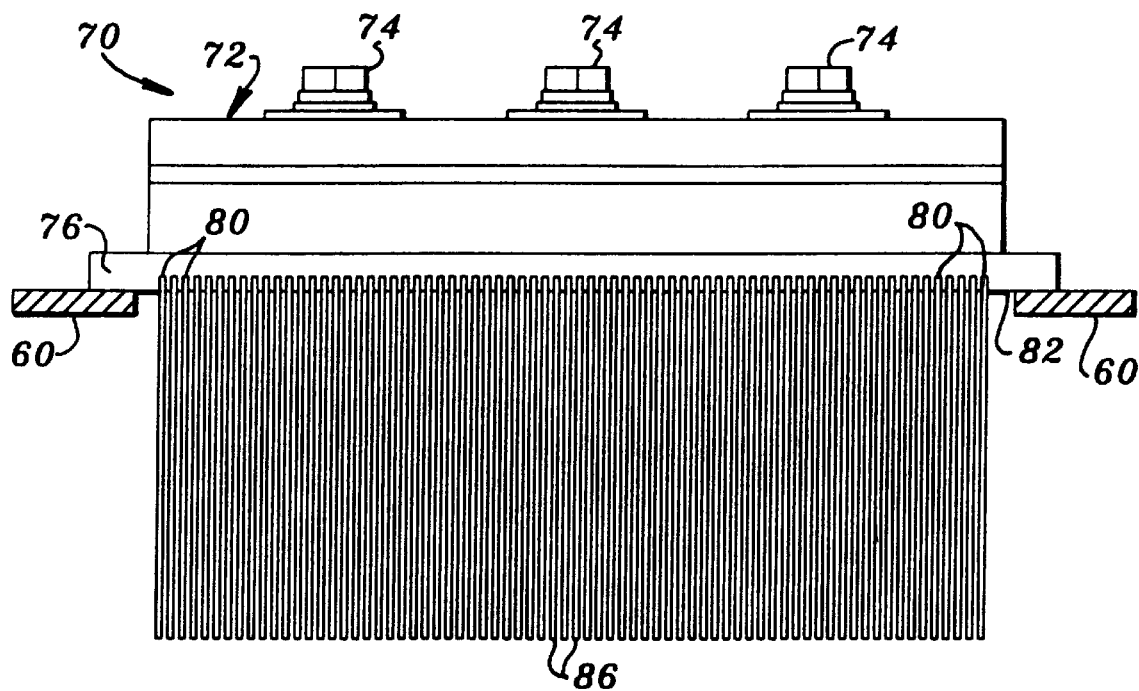
FIG. 4 is an IGBT module incorporating cooling fins in accordance with one feature of the present invention.

Referring to FIG. 4, a typical IGBT module 70 appears as an encapsulated unit 72 with exposed electrical terminals 74. The unit 72 is integrally bonded to a flat metal base plate 76, typically formed of high conductivity copper for better heat dissipation or a material with a coefficient of expansion closer to that of silicon for better thermal cycling capability. The base plate 76 is electrically isolated from the internal IGBT devices. The difficulty in using the IGBT module in high-power applications is in the removal of heat from the module through the single thermal plate 76. Prior IGBT applications at these power levels have utilized water cooling to obtain sufficient heat transfer from the module.

Applicants have improved the basic IGBT module as shown in FIG. 4 by using base plate 76 to provide a thermal interface to either cooling fins or to a separate heat sink. In one embodiment, the base plate 76 is formed with a plurality of slots 80 extending in parallel formation across the exposed surface 82 of base plate 76. It will be recognized that the slots 80 can be formed by various means, including casting in situ by extrusion or by machining. A corresponding plurality of relatively thin metal plates or fins 86 are tightly fitted into slots 80 so as to establish a thermal path between plate 76 and each of the fins 86. Various processes can be used to attach fins 86 to plate 76, including press-fit and adhesive bonding as well as other means known in the art, such as brazing. Each of the fins 86 may be copper or another material with a coefficient of expansion similar to the base material with a thickness of about 0.06 inches and a length related to the size of plate 76 and height determined by the heat dissipation required. In one embodiment, the plates or fins 86 were about 7 inches in length and 5.25 inches in height.

FIG. 5 is a simplified cross-sectional view corresponding to FIG. 3 illustrating mounting of the improved IGBT module comprising at least one IGBT device 71 in a locomotive cooling environment. The vertically oriented mounting wall 60 separating the electronics bay 26 from the air plenum 30 includes shaped openings for passing at least the fins 86 of each module 78. In embodiment of FIG. 5, it will be noted that the fins 86 are mounted to a separate base plate 88 and the plate 88 is abutted against and attached to plate 76 using a thermally conducting grease or other material to assure full surface contact between plates 88 and 76. The plates are preferably attached with metal fasteners (screws, bolts, etc.) in order to prevent separation during extended periods of operation in the vibratory environment of a locomotive. In this form, it may be feasible to attach the fins at a higher temperature or possibly to cast the plate 88 and fins 86 as an integral unit.

The base plate 88 abuts against the surface 90 of wall 60 and is fastened to wall 60 by screws, bolts, rivets or other well known means. A gasket 92 may be placed between plate 88 and wall 60 to prevent air leakage between plenum 30 and bay 26. Within the plenum 30, a barrier 94 attached to wall 60 extends over and adjacent first ends 96 of the fins 86. If desired, barrier 94 can be directly attached to (in contact with) the cooling fins. The fins 86 are oriented vertically in FIG. 5. An exhaust hood 98 has a lower portion 100 extending over second ends 102 of the fins 86 and terminating at wall 60. An upper portion 104 ends in a flange 106 which sealingly engages side edges 108 of the fins 86, such as through a gasket 110, at about a midpoint of the fins between the first edges or ends 96 and second edges or ends 102. The barrier 94 and lower portion 100 may be part of a box-like containment structure (not shown) enclosing all sides of the fins 86. With this arrangement, pressurized air in plenum 30 enters and flows over fins 86 as shown by arrows 112, exiting through exhaust hood 98.

FIG. 6 illustrates a further embodiment of the invention including a housing or containment structure 114 enclosing the fins 86 and abutting against the slotted face of the base plate 88. The open side of housing 114 is circumscribed by a flange 116 which can be bolted or otherwise attached to wall 60 with an intervening gasket. A centrally located partition 118 extends transversely of the fins 86 and is formed with a generally U-shaped cross-section. The fins 86 are shaped to fit about partition 118. An air inlet zone 120 is defined to one side of partition 118 and an air exhaust zone 122 is defined on an opposite side. The exhaust plenum 98 attaches over the air exhaust zone. The effect of partition 118 is to create an effective flow path which gives optimum and uniform heat transfer for cooling air through the fins 86.

Figure 7:
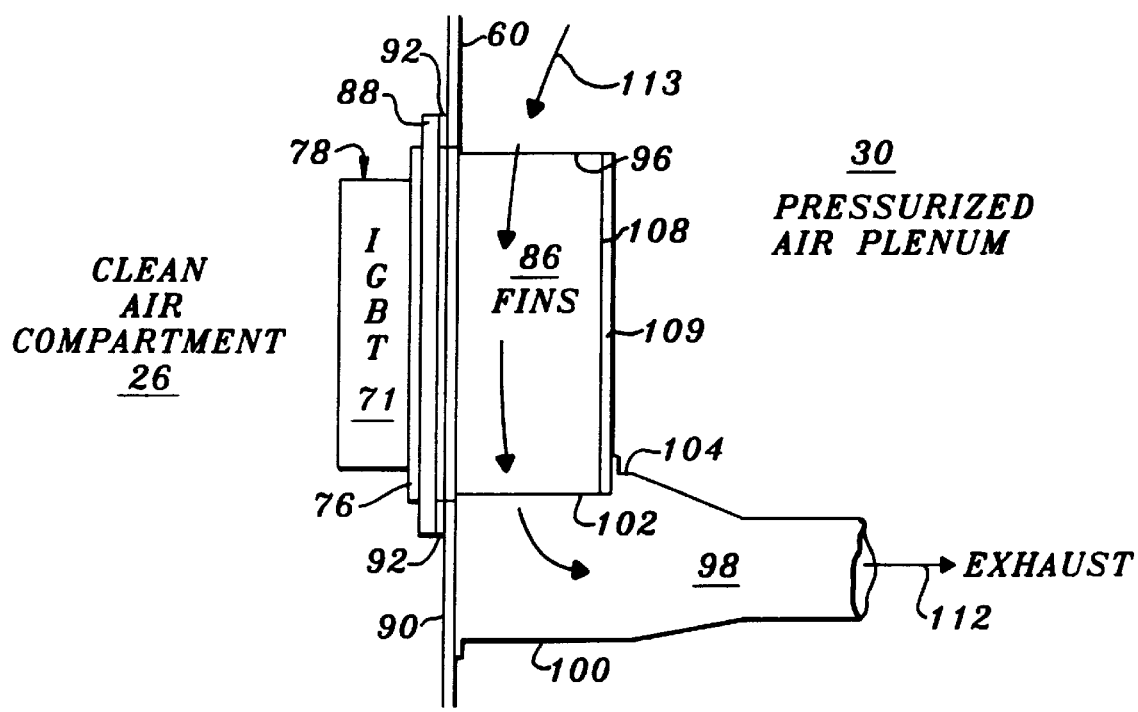
FIG. 7 illustrates another embodiment of IGBT mounting structure in accordance with the present invention.

FIG. 7 illustrates another embodiment of IGBT mounting structure in accordance with the present invention. In this embodiment, a back plate 109 is situated parallel to wall 60 and present over all or at least a portion of fins 86. Pressurized air in plenum 30 enters and flows over fins 86, as shown by arrows 113 from first ends 96 of fins 86 through second ends 102 and then exits through exhaust hood 98.

In the embodiment of FIG. 5, depending on the location of barrier 94, air can enter both from side edges 108 of the fins and from first ends 96. If barrier 94 is sealingly engaged to the fins, then no air will enter from first ends 96. Likewise, depending on the location of exhaust hood 98, air can exit both from side edges 108 and from second ends 102. If the exhaust hood is sealingly engaged to second ends 102 or otherwise does not leave space between second ends 102 and the hood interior, then air will not exit from second ends 102.

In the present invention, air can enter from first ends 96 and leave from second ends 102; air can enter from side edges 108 and leave from side edges 108; or air can enter and leave by a combination of side edges and first and/or second ends.

While the invention has been described in a preferred form, it is intended that the invention be interpreted within the full spirit and scope of the appended claims.

What is claimed is:

1. In a relatively high power electrical system including a plurality of IGBT modules connected in an electrical power switching circuit, the improvement wherein each of the IGBT modules includes:

an electrically isolated, thermally coupled base plate, the base plate having a plurality of closely spaced, heat radiating fins extending in parallel arrangement across an exposed surface of the base plate;

an electrical device compartment defined by at least one wall, an air exhaust conduit and an air supply plenum being formed on an opposite side of the wall from the electrical device compartment, the wall including a plurality of apertures therethrough from each of the air exhaust conduit and the air supply plenum, the IGBT modules being mounted to the one wall such that the IGBT device is positioned in the electrical device compartment and the plurality of fins extend through the one wall; and a barrier attached to the one wall adjacent each end of the fins for defining a cooling air flow path through the fins for cooling the modules.

2. In a relatively high power electrical system including a plurality of IGBT modules connected in an electrical power switching circuit, the improvement wherein each of the IGBT modules includes:

an electrically isolated, thermally coupled base plate, the base plate having a plurality of closely spaced, heat radiating fins extending in parallel arrangement across an exposed surface of the base plate;

an electrical device compartment defined by at least one wall, an air exhaust conduit and an air supply plenum being formed on an opposite side of the wall from the electrical device compartment, the wall including a plurality of apertures therethrough from each of the air exhaust conduit and the air supply plenum, the IGBT modules being mounted to the one wall such that the IGBT device is positioned in the electrical device compartment and the plurality of fins extend through the one wall; and a housing circumscribing the fins and a generally U-shaped partition extending across the housing transverse to the fins for defining a generally U-shaped air flow path through the fins for defining a cooling air flow path through the fins for cooling the modules.

3. In a relatively high power electrical system including a plurality of IGBT modules connected in an electrical power switching circuit, the improvement wherein each of the IGBT modules includes:

an electrically isolated, thermally coupled base plate, the base plate having a plurality of closely spaced, heat radiating fins extending in parallel arrangement across an exposed surface of the base plate;

an electrical device compartment defined by at least one wall, an air exhaust conduit and an air supply plenum being formed on an opposite side of the wall from the electrical device compartment, the wall including a plurality of apertures therethrough from each of the air exhaust conduit and the air supply plenum, the IGBT modules being mounted to the one wall such that the IGBT device is positioned in the electrical device compartment and the plurality of fins extend through the one wall; and a back plate situated parallel to the one wall and covering at least a portion of side edges of the fins for defining a cooling air flow path through the fins for cooling the modules.

4. In a relatively high power electrical system including a plurality of insulated gate bipolar transistors (IGBT) modules connected in an electrical power switching circuit, the IGBT modules generating heat during their switching operations, and cooling air directed to flow past the modules to dissipate the heat from the modules and enable continued operation of the IGBT modules, the improvement wherein each of the IGBT modules includes:

an electrically isolated, thermally coupled base plate;

a plurality of closely spaced, heat radiating fins of generally similar shape and size mounted on the base plate, with the fins extending in a generally parallel arrangement from a first end of the fins constituting a base end of the fins, across an exposed face of the base plate and toward a second end of the fins spaced from the base plate, constituting a remote end of the fins; and a barrier positioned at a first edge of the fins for blocking flow of cooling air between the edges thereof and defining a cooling air path between adjacent fins from the remote ends thereof for guiding a substantial portion of the cooling air directed toward the IGBT modules to flow along the cooling air path and between the fins for enhanced dissipation of heat generated by the IGBT modules.

5. In a relatively high power electrical system including a plurality of insulated gate bipolar transistors (IGBT) modules connected in an electrical power switching circuit, the IGBT modules generating heat during their switching operations, and cooling air directed to flow past the modules to dissipate the heat from the modules and enable continued operation of the IGBT modules, the improvement wherein each of the IGBT modules includes:

an electrically isolated, thermally coupled base plate;

a plurality of closely spaced, heat radiating fins of generally similar shape and size mounted on the base plate, with the fins extending in a generally parallel arrangement from a first end of the fins constituting a base end of the fins, across an exposed face of the base plate and toward a second end of the fins spaced from the base plate, constituting a remote end of the fins; and a housing having barriers at the edges of the fins for blocking flow of cooling air past the edges thereof and a partition extending generally transversely across the fins and projecting from the remote ends of the fins toward but stopping short of the base plate for guiding a substantial portion of the cooling air directed toward the IGBT modules to flow along the cooling air path from one side of the partition, between the partition and the base plate and to the other side of the partition between the fins for enhanced dissipation of heat generated by the IGBT modules.

6. In a relatively high power electrical system including a plurality of insulated gate bipolar transistors (IGBT) modules connected in an electrical power switching circuit, the IGBT modules generating heat during their switching operations, and cooling air directed to flow past the modules to dissipate the heat from the modules and enable continued operation of the IGBT modules, the improvement wherein each of the IGBT modules includes:

an electrically isolated, thermally coupled base plate;

a plurality of closely spaced, heat radiating fins of generally similar shape and size mounted on the base plate, with the fins extending in a generally parallel arrangement from a first end of the fins constituting a base end of the fins, across an exposed face of the base plate and toward a second end of the fins spaced from the base plate, constituting a remote end of the fins; and a closure member extending over at least a portion of the fins at the remote ends thereof and together with the base plate and fins defining a cooling air path between adjacent fins for guiding a substantial portion of the cooling air directed toward the IGBT modules to flow along the cooling air path and between the fins for enhanced dissipation of heat generated by the IGBT modules.

* * * * *